United States Patent
Sano et al.

(10) Patent No.: US 10,383,231 B2
(45) Date of Patent: Aug. 13, 2019

(54) COMPONENT-EMBEDDED BOARD AND METHOD OF MANUFACTURING SAME

(71) Applicant: FUJIKURA LTD., Tokyo (JP)

(72) Inventors: Yoshinori Sano, Sakura (JP); Masahiro Okamoto, Sakura (JP)

(73) Assignee: FUJIKURA LTD., Tokyo (JP)

( * ) Notice: Subject to any disclaimer, the term of this patent is extended or adjusted under 35 U.S.C. 154(b) by 170 days.

(21) Appl. No.: 14/759,459

(22) PCT Filed: Feb. 8, 2013

(86) PCT No.: PCT/JP2013/053099
§ 371 (c)(1),
(2) Date: Jul. 7, 2015

(87) PCT Pub. No.: WO2014/122779
PCT Pub. Date: Aug. 14, 2014

(65) Prior Publication Data
US 2015/0359103 A1    Dec. 10, 2015

(51) Int. Cl.
*H05K 1/18* (2006.01)
*H05K 1/11* (2006.01)
(Continued)

(52) U.S. Cl.
CPC ............. *H05K 1/185* (2013.01); *H01L 23/12* (2013.01); *H01L 23/13* (2013.01); *H01L 23/145* (2013.01);
(Continued)

(58) Field of Classification Search
CPC ........ H05K 1/111; H05K 1/141–1/144; H05K 1/023; H05K 1/162–1/167; H01L 2904/01078–2904/01079
(Continued)

(56) References Cited

U.S. PATENT DOCUMENTS

| 7,550,320 B2 * | 6/2009 | Wang ...................... H05K 1/186 438/106 |
| 2007/0074900 A1 * | 4/2007 | Lee ........................ H05K 1/185 174/260 |

(Continued)

FOREIGN PATENT DOCUMENTS

| JP | 2006-093439 A | 4/2006 |
| JP | 2008-270362 A | 11/2008 |

(Continued)

OTHER PUBLICATIONS

Japanese Office Action issued in JP 2011-190527 dated Jul. 17, 2012.

(Continued)

*Primary Examiner* — Tuan T Dinh
(74) *Attorney, Agent, or Firm* — Osha Liang LLP

(57) ABSTRACT

Provided is a component-embedded board which includes: a first board including a first insulation layer, a first conductive layer formed on a second face of the first insulation layer, and an interlayer conductive portion penetrating the first insulation layer to be connected to the first conductive layer and protruding from a first face of the first insulation layer; an electric component connected to the interlayer conductive portion; and a second board including a second insulation layer having an opening portion incorporating the electric component, and a second conductive layer formed on at least either one of a first face and a second face of the second insulation layer. The second conductive layer includes a frame portion. The opening portion is formed so as to penetrate the second insulation layer in a thickness direction thereof over the entirety of the inner region of the frame portion.

10 Claims, 10 Drawing Sheets

(51) Int. Cl.
   *H05K 1/02* (2006.01)
   *H05K 3/40* (2006.01)
   *H05K 3/00* (2006.01)
   *H01L 23/13* (2006.01)
   *H01L 23/14* (2006.01)
   *H01L 23/538* (2006.01)
   *H05K 3/46* (2006.01)
   *H01L 23/12* (2006.01)
   *H01L 23/00* (2006.01)
   *H05K 3/42* (2006.01)

(52) U.S. Cl.
   CPC .......... *H01L 23/5389* (2013.01); *H01L 24/19* (2013.01); *H05K 1/0298* (2013.01); *H05K 1/115* (2013.01); *H05K 1/186* (2013.01); *H05K 3/002* (2013.01); *H05K 3/0032* (2013.01); *H05K 3/4038* (2013.01); *H05K 3/4697* (2013.01); *H01L 2224/04105* (2013.01); *H01L 2224/73267* (2013.01); *H05K 3/427* (2013.01); *H05K 2201/09818* (2013.01); *H05K 2203/061* (2013.01)

(58) Field of Classification Search
   USPC .......... 361/763–766, 792–795; 174/258–261
   See application file for complete search history.

(56) References Cited

U.S. PATENT DOCUMENTS

| | | | |
|---|---|---|---|
| 2007/0278644 | A1* | 12/2007 | Hsu ................... H01L 23/5389 257/686 |
| 2008/0041619 | A1* | 2/2008 | Lee ......................... H01L 24/24 174/260 |
| 2010/0078205 | A1 | 4/2010 | Sakai et al. |
| 2010/0163168 | A1* | 7/2010 | Saita ................... H01L 21/4857 156/247 |
| 2011/0048780 | A1 | 3/2011 | Jeong et al. |
| 2012/0287586 | A1* | 11/2012 | Mikado ................. H05K 1/185 361/748 |
| 2013/0003314 | A1 | 1/2013 | Igarashi et al. |

FOREIGN PATENT DOCUMENTS

| | | |
|---|---|---|
| JP | 2010-016339 A | 1/2010 |
| JP | 2010-050475 A | 3/2010 |
| JP | 2010-182927 A | 8/2010 |
| JP | 2011-049555 A | 3/2011 |
| WO | 2010/038489 A1 | 4/2010 |
| WO | 2011/102561 A1 | 8/2011 |

OTHER PUBLICATIONS

Japanese Notice of Allowance issued in JP 2011-190527 dated Nov. 27, 2012.

* cited by examiner

PRIOR ART

PRIOR ART

COMPONENT-EMBEDDED BOARD AND METHOD OF MANUFACTURING SAME

CROSS REFERENCE TO RELATED APPLICATIONS

This is a National Stage of International Application No. PCT/JP2013/053099 filed Feb. 8, 2013, the contents of which are incorporated herein by reference in its entirety.

TECHNICAL FIELD

The present invention relates to a component-embedded board incorporating an electric component and a method of manufacturing the same.

BACKGROUND ART

Miniaturization and high functionality of electric equipment has been achieved as well as miniaturization of electronic components incorporated in equipment. Even for a printed wiring board for mounting electric components, higher density, multilayer, multi-layering, and enhancement of high-speed transmission characteristics are required. As a technology to meet these requirements, there is a packaging technology called EWLP (Embedded Wafer Level Package).

EWLP is a technology for mounting semiconductor components (electric component) such as a WLCSP (Wafer Level Chip Size Package) to a printed wiring board. According to EWLP, it is possible to improve the packaging density, reduce the wiring length between the semiconductor elements, and enhance the high-speed transmission characteristics.

A component-embedded board is known in which a single-sided wiring board is laminated on both sides of a double-sided wiring board in which an electric component is embedded (see Patent Document 1).

FIG. 13 is an example of a component-embedded board. The component-embedded board 100 includes a double-sided wiring board A102 in which a conductive layer 4 is formed on both faces of an insulation resin layer 3, and single-sided wiring boards A101 and A103 each in which the conductive layer 4 is formed on the outer side of the insulation resin layer 3. The single-sided wiring boards A101 and A103 are laminated on one and the other faces of the double-sided wiring board A102. An electric component 2 is embedded in an opening portion 6 formed in the insulation resin layer 3 of the double-sided wiring board A102.

The wiring boards A101-A103 are adhered together with an adhesion layer 5 and electrically connected to each other through an interlayer conductive portion 1.

FIG. 14 and FIG. 15 show a process of forming the opening portion 6 in the insulation resin layer 3 of the double-sided wiring board A102. As shown in the figures, the opening portion 6 is formed in the insulation resin layer 3 of a plurality of the double-sided wiring board A102 before the dicing by laser processing or drill processing, for example.

FIGS. 16A and 16B are a plan view showing the insulation resin layer 3 of the double-sided wiring board A102 in the process of forming the opening portion 6. By removing off by laser processing or drill processing the area 6a shown by a two-dot chain line in FIG. 16A, the opening portion 6 shown in FIG. 16B can be formed.

PRIOR ART DOCUMENTS

Patent Documents

[Patent Document 1] Japanese Unexamined Patent Application, First Publication No. 2008-270362

DISCLOSURE OF INVENTION

Problems to be Solved by the Invention

However, in the above-described component-embedded board, because there is a risk in that a misalignment of the formed opening portion 6 may cause an adverse effect on the embedding of the electric component 2, it is necessary to form the opening portion 6 in a large way with the consideration of the misalignment. In this regard, there is a demand for improvement in miniaturization of the component-embedded board.

The present invention was made in view of the above-described circumstances and the object thereof is providing a component-embedded board and a method of manufacturing the same which enable an opening portion for the embedding of an electric component to be miniaturized.

Means for Solving the Problems

A component-embedded board according to an aspect of the present invention includes: a first board including a first insulation layer having a first face and a second face, a first conductive layer formed on the second face of the first insulation layer, and an interlayer conductive portion penetrating the first insulation layer to be connected to the first conductive layer and protruding from the first face of the first insulation layer; an electric component connected to the interlayer conductive portion; and a second board including a second insulation layer having a first face, a second face, and an opening portion incorporating the electric component, and a second conductive layer formed on at least either one of the first face and the second face of the second insulation layer, wherein the second conductive layer includes a frame portion having a frame shape in a plan view, and wherein the opening portion is formed so as to penetrate the second insulation layer in a thickness direction thereof over the entirety of the inner region of the frame portion.

It may be arranged such that the frame portion is formed on the first face and the second face of the second insulation layer, an area of the inner region of the frame portion formed on the second face of the second insulation layer is greater than an area of the inner region of the frame portion formed on the first face of the second insulation layer, and the inner region of the frame portion formed on the second face of the second insulation layer encompasses, in a plan view, the inner region of the frame portion formed on the first face of the second insulation layer.

It may be arranged such that the first board and the second board are arranged such that the first face of the first insulation layer and the second face of the second insulation layer oppose each other.

It may be arranged such that the inner peripheral edge of the frame portion formed on the second face of the second insulation layer is positioned outward from the inner peripheral edge of the frame portion formed on the first face of the second insulation layer in a plan view over the entire periphery, and the electric component is connected to the interlayer conductive portion via the conductive layer formed on a face of the electric component, the face opposing the first board.

It may be arranged such that the above-described component-embedded board further includes a third board which includes a third insulation layer having a first face and a second face, a third conductive layer formed on the first face of the third insulation layer, and an interlayer conductive portion penetrating the third insulation layer to be connected to the third conductive layer and protruding from the second face of the third insulation layer, wherein the second board and the third board are arranged such that the second face of the third insulation layer and the first face of the second insulation layer oppose each other.

A method of manufacturing the above-described component-embedded board according to an aspect of the present invention includes: forming the opening portion by delivering a laser beam to the inner region of the frame portion formed on the first face of the second insulation layer to penetrate the second insulation layer present inside the frame portion formed on the first face of the second insulation layer in the thickness direction thereof, wherein, in forming the opening portion, the laser beam is delivered at least to a region including the inner peripheral edge of the frame portion formed on the first face of the second insulation layer.

A method of manufacturing the above-described component-embedded board according to an aspect of the present invention includes: forming the opening portion by penetrating the second insulation layer in the thickness direction thereof by performing a wet etching inside the frame portion formed on the first face of the second insulation layer.

Effects of the Invention

Based on the above-described aspects of the present invention, since the opening portion is formed in the inner region of the frame portion of the second conductive layer, the position of the opening portion will not be misaligned with respect to the second conductive layer (electrically conductive circuit).

Accordingly, it is unnecessary to form an opening portion in a large way with consideration of the misalignment of the formed opening portion, which will achieve the miniaturization of the component-embedded board.

In addition, the opening portion is formed along the inner peripheral edge of the frame portion, and thus the shape of the opening portion (e.g., the shape of the corners of a rectangular opening portion) will not depend on the spot diameter of a laser beam or the diameter of a drill. In this regards, a laser beam having a large spot diameter can be used, which, as a result, will reduce the machining time.

Moreover, since it is unnecessary to consider the diameter of a laser beam or the diameter of a drill, a degree of freedom in design in terms of the size, the shape, and the like of the opening portion will be improved, which is advantageous in achieving the miniaturization of the component-embedded board.

EMBODIMENTS FOR CARRYING OUT THE INVENTION

Embodiments of the present invention will be described with reference to the drawings.

Figure 1:
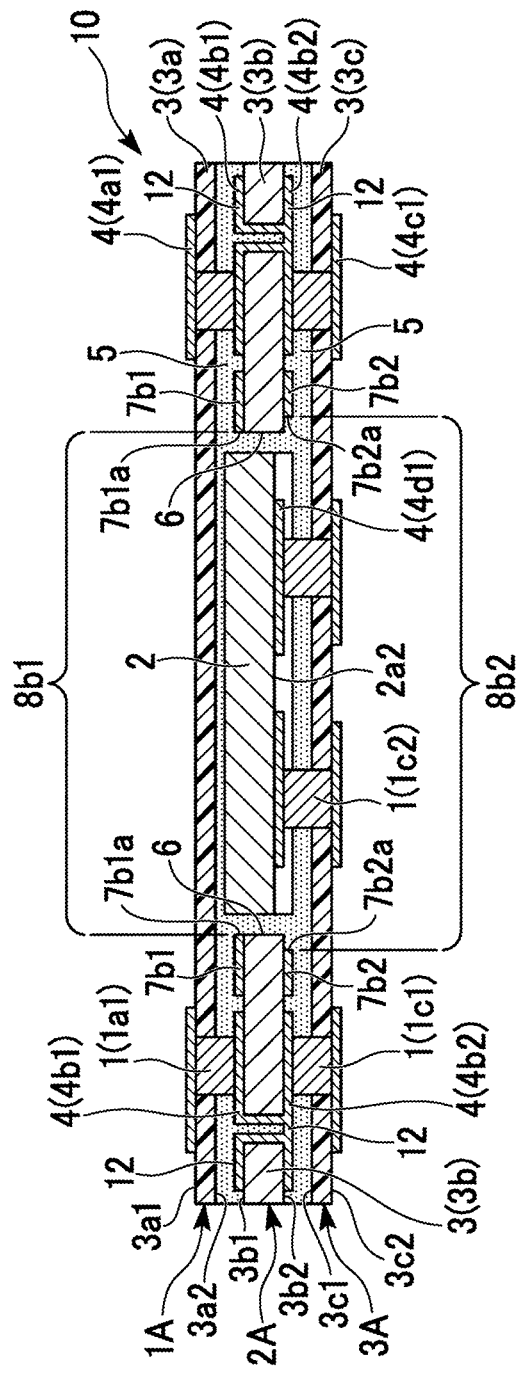
FIG. 1 is a cross-sectional view showing a component-embedded board according to an embodiment of the present invention.
Figure 2:
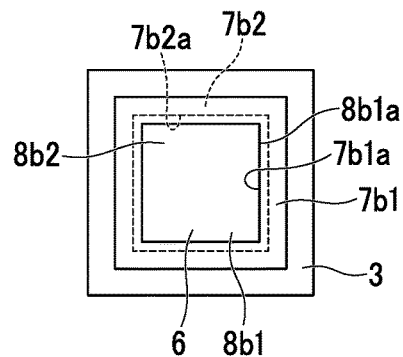
FIG. 2 is a plan view showing the frame portion and the opening portion of the component-embedded board of FIG. 1.

FIG. 1 is a cross-sectional view showing a component-embedded board 10 according to the present embodiment. FIG. 2 is a plan view showing a frame portion 7 and an opening portion 6 of the component-embedded board 10. Hereinafter, the positional relationship of components may be explained based on the up-down positional relationship in FIG. 1.

As shown in FIG. 1, the component-embedded board 10 is, for example, a laminated printed wiring board with a built-in electric component 2. Wiring boards 1A, 3A being a single-sided wiring board are laminated on one and the other faces of the double-sided wiring board 2A incorporating the electric component 2.

Wiring boards 1A-3A include an insulation resin layer 3 made of, for example, polyimide or the like and a conductive layer 4 formed on either or both of the faces of the insulation resin layer 3 and made of an electrical conductive material such as a copper, adhered to each other via an adhesive layer 5, and connected to each other with an interlayer conductive portion 1.

In the upper-layer wiring board 1A (third board), a conductive layer 4 (4a1) (third conductive layer) is formed on the first face 3a1 (upper face in FIG. 1) of the insulation resin layer 3 (3a) (third insulation layer). The interlayer conductive portion 1 (1a1) is formed in the insulation resin layer 3 (3a), the interlayer conductive portion penetrating the insulation resin layer 3 to be connected to the conductive layer 4 (4a1) and protruding from the second face 3a2 (lower face in FIG. 1). In the example of FIG. 1, a plurality of the interlayer conductive portion 1 (1a1) are formed, but it may be arranged to form at least one interlayer conductive portion.

The bottom end of the interlayer conductive portion 1 (1a1) reaches the conductive layer 4 (4b1) formed on the first face (upper face) of the double-sided wiring board 2A, and thereby connecting between the conductive layer 4 (4a1) of the upper-layer wiring board 1A and the conductive layer 4 (4b1) of the double-sided wiring board 2A.

A single-sided copper-clad laminate (CCL) may be used for the upper-layer wiring board 1A, the CCL including: the insulation resin layer 3 formed of, for example, polyimide; and the conductive layer 4 arranged on one face of the insulation resin layer 3 and formed of an electrically conductive material such as a copper.

In the double-sided wiring board 2A (second board), the conductive layer 4 (4b1) (second conductive layer) is formed on the first face 3b1 (upper face) of the insulation resin layer 3 (3b) (second insulation layer), while the conductive layer 4 (4b2) (second conductive layer) is formed on the second face 3b2 (lower face).

The opening portion 6 is formed in the insulation resin layer 3 (3b) at a positon in which the electric component 2 is embedded.

As shown in FIG. 1 and FIG. 2, the conductive layer 4 (4b1) formed on the first face 3b1 (upper face) of the insulation resin layer 3 (3b) includes a frame portion 7b1 (frame portion of the first face) having a frame shape in a plan view.

The frame portion 7b1 is a part of the conductive layer 4 (4b1), and formed of, for example, an electrically conductive material such as a copper. The remaining part of the conductive layer 4 (4b1) constitutes an electrically conductive circuit 12 (circuit layer).

The external form of the frame portion 7b1 (form in a plan view) is not particularly limited, and may be, for example, a rectangle shape (square, rectangular), a circular shape, or an indefinite shape. The external form of the frame portion 7b1 of the example shown in the figures is rectangle (square).

The form of the inner region 8b1 of the frame portion 7b1 in a plan view (form defined by the inner peripheral edge 7b1a of the frame portion 7b1) may be determined in accordance with the form of the electric component 2, and may be, for example, a rectangle shape (square, rectangular), a circular shape, or an indefinite shape. The inner region 8b1 of the example shown in the figures is rectangle (square). The frame portion 7b1 may be, for example, a rectangular frame having a certain width.

In the insulation resin layer 3 (3b), the opening portion 6 is formed in the inner region 8b1 of the frame portion 7b1, the opening portion having the same shape as the inner region 8b1 in a plan view. The opening portion 6 is formed so as to penetrate the insulation resin layer 3 (3b) in the thickness direction over the entirety of the inner region 8b1.

The conductive layer 4 (4b2) formed on the second face 3b2 (lower face) of the insulation resin layer 3 (3b) includes a frame portion 7b2 (frame portion of the second face) having a frame shape in a plan view.

The frame portion 7b2 is a part of the conductive layer 4 (4b2), and formed of, for example, an electrically conductive material such as a copper. The remaining part of the conductive layer 4 (4b2) constitutes the electrically conductive circuit 12 (circuit layer).

The external form of the frame portion 7b2 (form in a plan view) is not particularly limited, and may be, for example, a rectangle shape (square, rectangular), a circular shape, or an indefinite shape. The external form of the frame portion 7b2 of the example shown in the figures is rectangle (square). The form of the inner region 8b2 of the frame portion 7b2 in a plan view (the form defined by the inner peripheral edge 7b2a of the frame portion 7b2) may be, for example, a rectangle shape (square, rectangular), a circular shape, or an indefinite shape. The inner region 8b2 of the example shown in the figures is rectangle (square). The frame portion 7b2 may be, for example, a rectangular frame having a certain width.

As shown in FIG. 2, it is preferable that the area of the inner region 8b2 of the frame portion 7b2 formed on the second face 3b2 (lower face in FIG. 1) of the insulation resin layer 3 (3b) be greater than the area of the inner region 8b1 of the frame portion 7b1 formed on the first face 3b1 (upper face in FIG. 1), and the inner region 8b2 encompasses the inner region 8b 1 in a plan view.

It is preferable that the inner peripheral edge 7b2a of the frame portion 7b2 is positioned outward from the inner peripheral edge 7b1a of the frame portion 7b1 in a plan view over the entire periphery. It is preferable that the inner peripheral edge 7b2a is positioned outward from the inner peripheral edge 7b1a with a certain gap therebetween over the entire periphery.

In the example shown in the figures, the four sides of the inner peripheral edge 7b2a may be positioned, for example, 20-50 μm outward from the corresponding sides of the inner peripheral edge 7b1a. It is preferable that the length of the sides of the inner peripheral edge 7b2a be longer than the corresponding sides of the inner peripheral edge 7b1a by, for example, 30-150 μm.

In the example shown in FIG. 2, the area of the inner region 8b2 of the frame portion 7b2 is greater than the area of the inner region 8b1 of the frame portion 7b1, and the inner region 8b2 encompasses the inner region 8b1 in a plan view. Therefore, misalignment of the position of the frame portion 7b2 in a plan view with respect to the frame portion 7b1 will not affect on the size of the opening portion 6. Thus, it is possible to prevent the frame portion 7b2 from protruding into the opening portion 6 and prevent the effective opening area of the opening portion 6 from becoming reduced. For this reason, the embedding of the electric component 2 into the opening portion 6 and the connection between the electric component 2 and the interlayer conductive portion can be reliably performed. Accordingly, it is possible to reliably prevent the reduction of the production yield due to incomplete incorporation of the electric component 2 into the opening portion 6 caused by the protrusion of the frame portion 7b2.

A double-sided copper-clad laminate (CCL) including: the insulation resin layer 3 formed of, for example, polyimide; and the conductive layer 4 provided on both faces of the insulation resin layer 3 may be employed for the double-sided wiring board 2A.

As shown in FIG. 1, in the lower-layer wiring board 3A (first board), the conductive layer 4 (4c1) (first conductive layer) is formed on the second face 3c2 (lower face) of the insulation resin layer 3 (3c) (first insulation layer). The interlayer conductive portion 1 (1c1, 1c2) is formed on the insulation resin layer 3 (3c), the interlayer conductive portion penetrating the insulation resin layer 3 to be connected to the conductive layer 4 (4c1) and protruding from the first face 3c1 (upper face). In the example of FIG. 1, a plurality of the interlayer conductive portion 1 (1c1, 1c2) are formed, but it may be arranged to form at least one interlayer conductive portion.

In the example shown in FIG. 1, the top end of part of the interlayer conductive portion 1 (1c1) reaches the conductive layer 4 (4b2) of the second face 3b2 (lower face) of the double-sided wiring board 2A, and thereby connecting between the conductive layer 4 (4b2) of the double-sided wiring board 2A and the conductive layer 4 (4c1) of the lower-layer wiring board 3A.

The top end of the remaining part of the interlayer conductive portion 1 (1c2) reaches the conductive layer 4 (4d1) of the electric component 2, and thereby connecting between the conductive layer 4 (4d1) of the electric component 2 and the conductive layer 4 (4c2) of the lower-layer wiring board 3A.

The electric component 2 may be a passive component such as resistor and capacitor, or may be an active component such as IC, diode, transistor. In addition, the electric component 2 may be a semiconductor (bare) chip having a semiconductor element or a WLCSP.

The conductive layer 4 (4d1) is formed on the second face 2a2 (lower face) of the electric component 2.

The electric component 2 is arranged inside the opening portion 6 of the double-sided wiring board 2A and thus is arranged between the upper-layer wiring board 1A and the lower-layer wiring board 3A.

A wide variety of know adhesives in the manufacturing domain of printed wiring boards may be employed for the adhesion layer 5. Preferable examples thereof includes polyimide-based adhesive and epoxy-based adhesive.

The interlayer conductive portion 1 may be formed by heating and curing conductive paste containing metal particles such as nickel, silver, copper, tin, bismuth, indium, and lead.

Hereinbelow, an example of a method of manufacturing a component-embedded board according to the present embodiment will be explained in detail.

Figure 3:
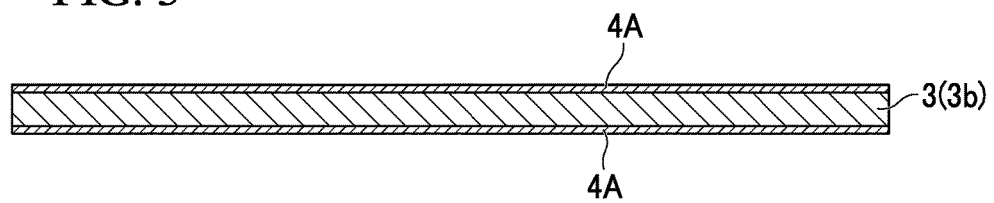
FIG. 3 is a process drawing showing a method of manufacturing the component-embedded board shown in FIG. 1.
Figure 4:
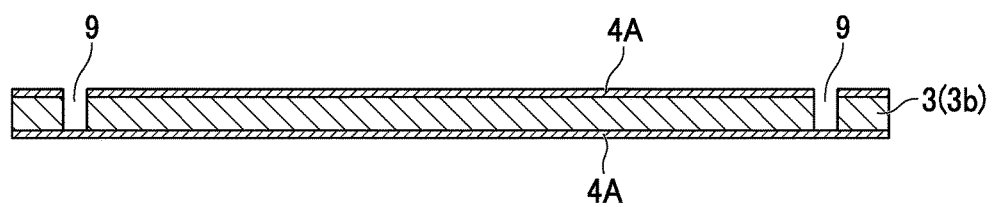
FIG. 4 is a process drawing following the previous figure.
Figure 5:
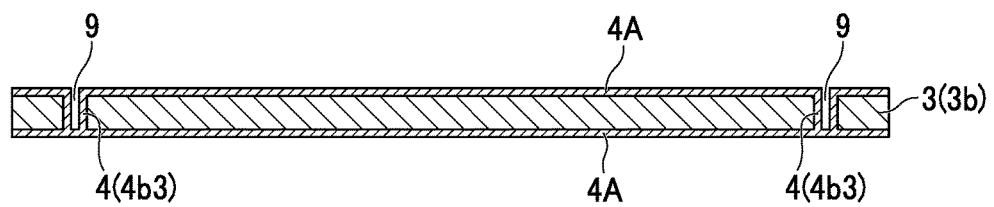
FIG. 5 is a process drawing following the previous figure.

As shown in FIG. 3, the insulation resin layer 3 (3b) of which both faces are provided with the conductive layer 4A is prepared. As shown in FIG. 4, a through hole(s) 9 is formed in the insulation resin layer 3 by laser processing or the like. As shown in FIG. 5, the conductive layer 4 (4b3) formed on the inner face of the through hole 9 by a electrolytic plating or the like to mutually connect the conductive layers 4 formed on both faces of the insulation resin layer 3.

Figure 6:
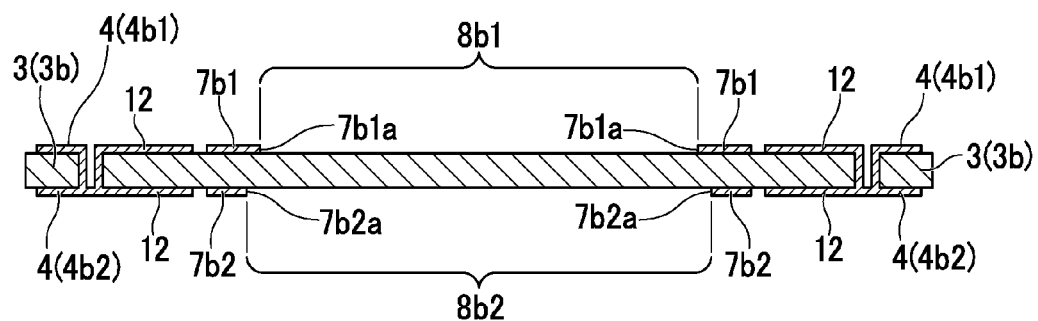
FIG. 6 is a process drawing following the previous figure.

As shown in FIG. 6, the conductive layer 4A is patterned by photolithography to form the conductive layer 4. The formed conductive layer 4 includes the frame portions 7b1, 7b2 and the electrically conductive circuit 12.

The frame portions 7b1, 7b2 are part of the conductive layers 4 as with the electrically conductive circuit 12, and are formed at the same time as the electrically conductive circuit 12. For this reason, the position of the opening portion 6 will not be misaligned with respect to the electrically conductive circuit 12. Accordingly, it is possible to improve the accuracy of the mounting position of the electric component 2.

Figure 7:
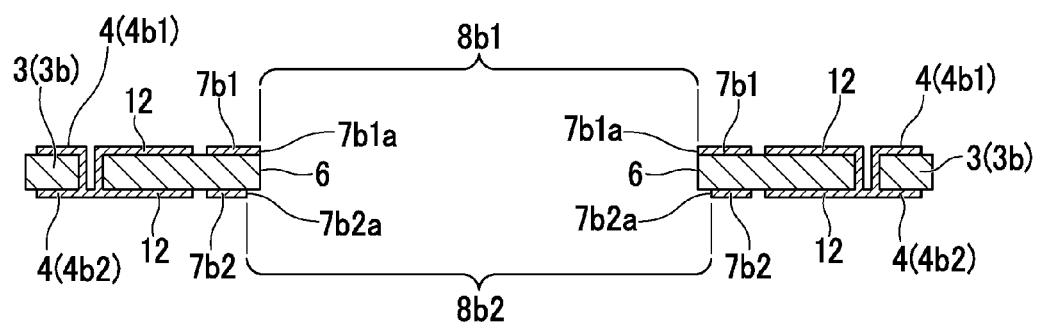
FIG. 7 is a process drawing following the previous figure.

After that, as shown in FIG. 7, the insulation resin layer 3 (3b) of the inner region 8b1 of the frame portion 7b1 is removed by laser processing, which forms the opening portion 6 having the same shape as the inner region 8b1 (shape in a plan view).

A formation process of the opening portion 6 will be described below in detail with reference to FIG. 9 and FIG. 10.

Figure 9:
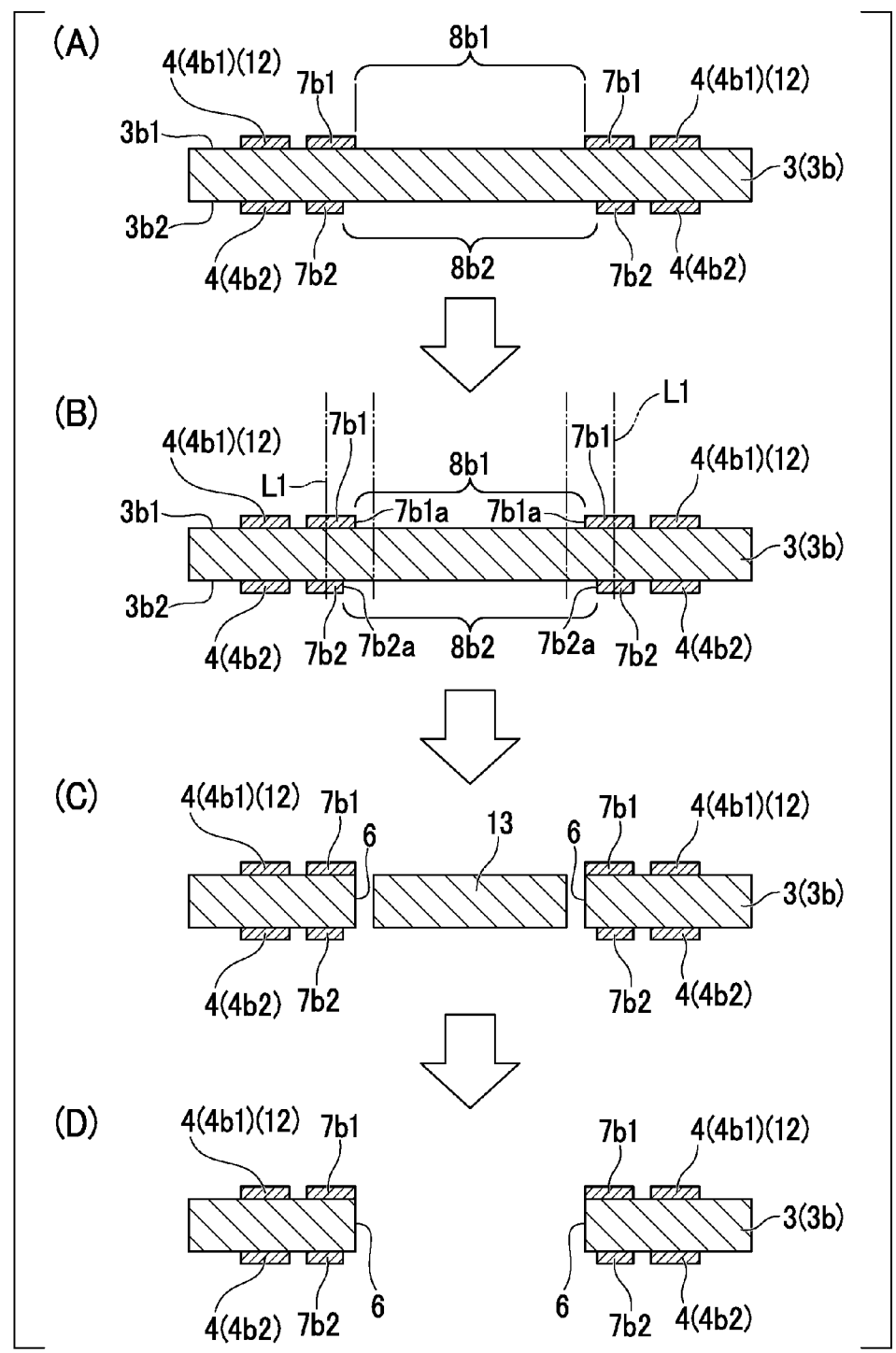
FIG. 9 is a cross-sectional view schematically showing an example of a process of forming the opening portion.

As shown in FIG. 9 (A) and FIG. 9 (B), the inner region 8b1 of the frame portion 7b1 is irradiated with a laser beam L1. Specifically, the laser beam L1 is delivered at least to the peripheral edge 8b1a of the inner region 8b1 (refer to FIG. 10 (A)) and the insulation resin layer 3 (3b) present in the inner region 8b 1. In this example, the laser beam L1 is delivered to the inner peripheral edge 7b1a while being moved along the inner peripheral edge 7b1a. It should be noted that the laser beam L1 may be delivered to the entirety of inner region 8b1 at once. Examples of a laser used for the laser processing may include carbon dioxide lasers and excimer lasers.

Figure 10:
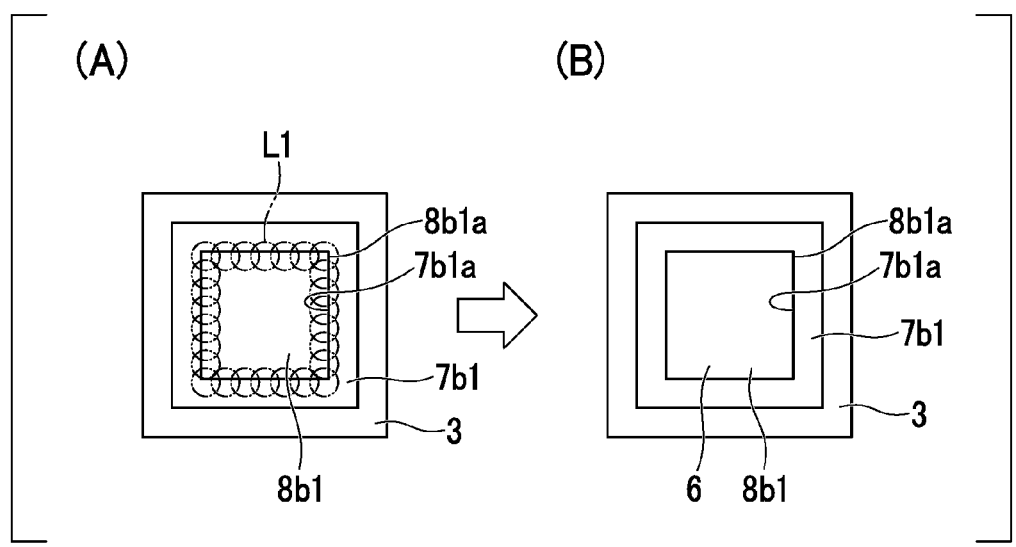
FIG. 10 is a plan view schematically showing a process of forming the opening portion.

As shown in FIG. 9 (B) and FIG. 10 (A), it is preferable that the laser beam L1 be delivered at least to the region including the inner peripheral edge 7b1a of the frame portion 7b1. In this example, part of the laser beam L1 is delivered to the frame portion 7b1 including the inner peripheral edge 7b1a, while the remaining part is delivered to the insulation resin layer 3 (3b) including the peripheral edge 8b1a of the inner region 8b1.

By delivering the laser beam L1 to a region including the inner peripheral edge 7b1a of the frame portion 7b1, the laser beam L1 will be reliably delivered to the peripheral edge 8b1a of the inner region 8b1, and thus it is possible to reliably form the opening portion 6 having the same shape as the inner region 8b 1.

The output of the laser beam L1 is preferably adjusted such that only the insulation resin layer 3 is removed and the frame portion 7b1 is not damaged.

By delivering the laser beam L1 along the inner peripheral edge 7b1a over the entire periphery, it is possible to form the opening portion 6 in the insulation resin layer 3 (3b).

As shown in FIG. 9 (C) and FIG. 9 (D), a cut out portion 13 of the insulation resin layer 3 which is cut out by performing laser processing along the inner peripheral edge 7b1a is removed.

Since the laser beam L1 is delivered to the region including the peripheral edge 8b1a of the inner region 8b1 in the insulation resin layer 3 (3b), it is possible to accurately form the opening portion 6 having the same shape as the inner region 8b1 as shown in FIG. 9 (D) and FIG. 10 (B).

Figure 14:
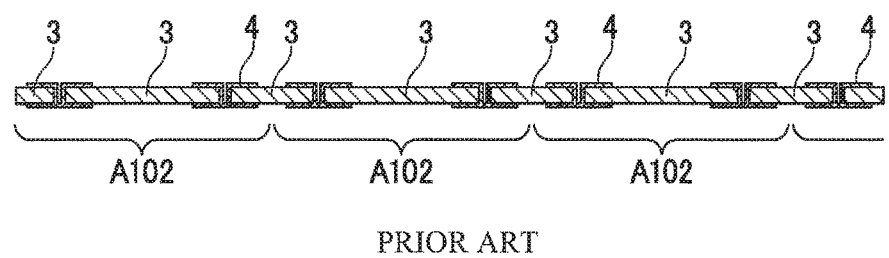
FIG. 14 is a process drawing showing a manufacturing process of the component-embedded board of the previous figure.
Figure 15:
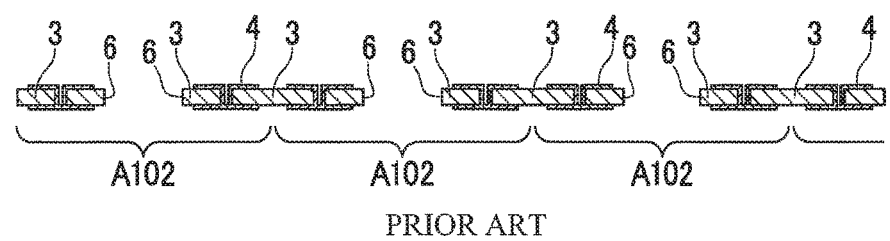
FIG. 15 is a process drawing following the previous figure.
Figure 16A:
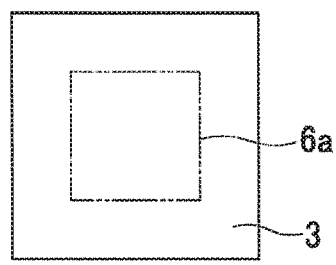
FIG. 16A is a plan view showing an insulation resin layer before forming the opening portion.
Figure 16B:
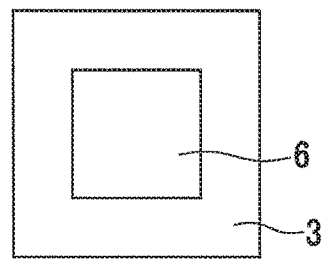
FIG. 16B is a plan view showing an insulation resin layer to which the opening portion is formed.

The formation of the opening portion 6 may be performed to the insulation resin layer 3 after the dicing, or may be performed to the insulation resin layer 3 before the dicing (refer to FIG. 14 and FIG. 15).

Figure 8:
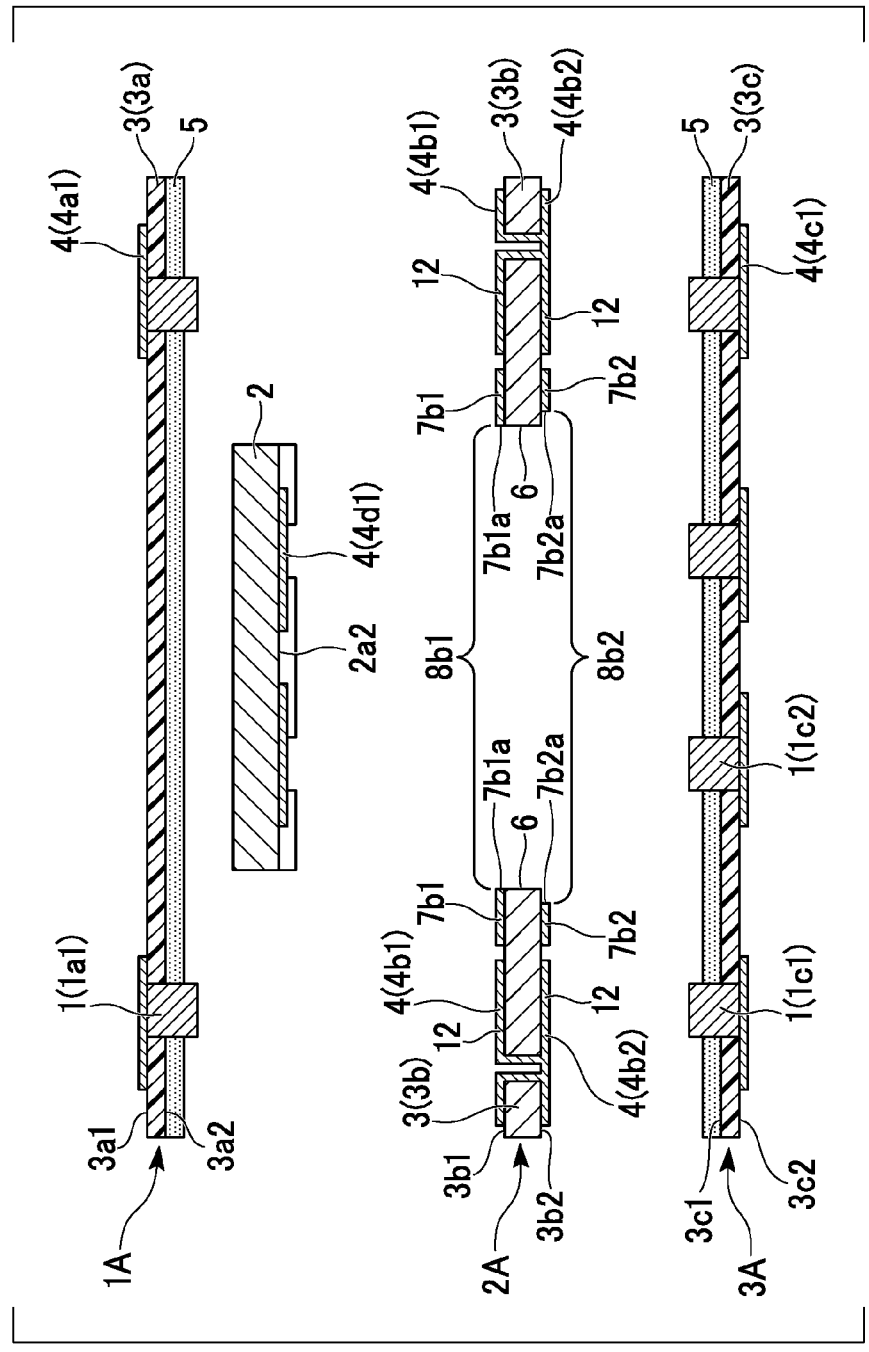
FIG. 8 is a process drawing following the previous figure.

As shown in FIG. 8, the upper-layer wiring board 1A, the double-sided wiring board 2A, the lower-layer wiring board 3A, and the electric component 2 are aligned to each other, and the wiring boards 1A-3A and the electric component 2 are laminated by a collective lamination method to obtain the component-embedded board 10 shown in FIG. 1. In the example of FIG. 8, the electric component 2 is introduced into the opening portion 6 of the double-sided wiring board 2A such that the conductive layer 4 (4d1) of the electric component 2 opposes the lower-layer wiring board 3A, and the conductive layer 4 (4d1) is connected to the interlayer conductive portion 1 (1c2) of the lower-layer wiring board 3A.

In the process of laminating the wiring boards 1A-3A and the electric component 2, a large amount of force is loaded to the double-sided wiring board 2A in the thickness direction thereof. However, because the frame portions 7b1, 7b2 serve as a reinforcer, it is possible to prevent a bending deformation of the insulation resin layer 3 (3b) due to the fluidity of the adhesive layer 5, and thus ensure the flatness of the component-embedded board 10.

In the component-embedded board 10, since the opening portion 6 is formed in the inner region 8b1 of the frame portion 7b1 of the conductive layer 4 (4b1), the position of the opening portion 6 will not be misaligned with respect to the conductive layer 4 (4b1, electrically conductive circuit 12).

Accordingly, it is unnecessary to form the opening portion 6 in a large way with consideration of the misalignment of the formed opening portion 6, which will achieve the miniaturization of the component-embedded board 10.

In addition, the opening portion 6 is formed along the inner peripheral edge 7b1a of the frame portion 7b1, and thus the shape of the opening portion 6 (e.g., the shape of the corners of a rectangular opening portion 6) will not depend on the spot diameter of a laser beam or the diameter of a drill which are used to form the opening portion 6. In this regard, a laser beam L1 having a large spot diameter can be used, which will reduce the machining time. The machining time can be reduced to, for example, approximately ⅓-⅕ in comparison with the case in which no such a frame portion is present.

Moreover, since it is unnecessary to consider the diameter of a laser beam or the diameter of a drill, a degree of freedom in design in terms of the size and the shape of the opening portion 6 will be improved, which is advantageous in achieving the miniaturization of the component-embedded board 10.

The opening portion 6 is formed by laser processing in the above-described manufacturing method, but the opening portion 6 can be formed by the other methods. Hereinafter, an example of a process of forming the opening portion 6 by wet etching will be explained.

In accordance with the process drawings shown in FIG. 3-FIG. 6, the insulation resin layer 3 (3b) (hereinafter, referred to as a wiring board 2B) including the conductive layer 4 is manufactured.

Figure 11:
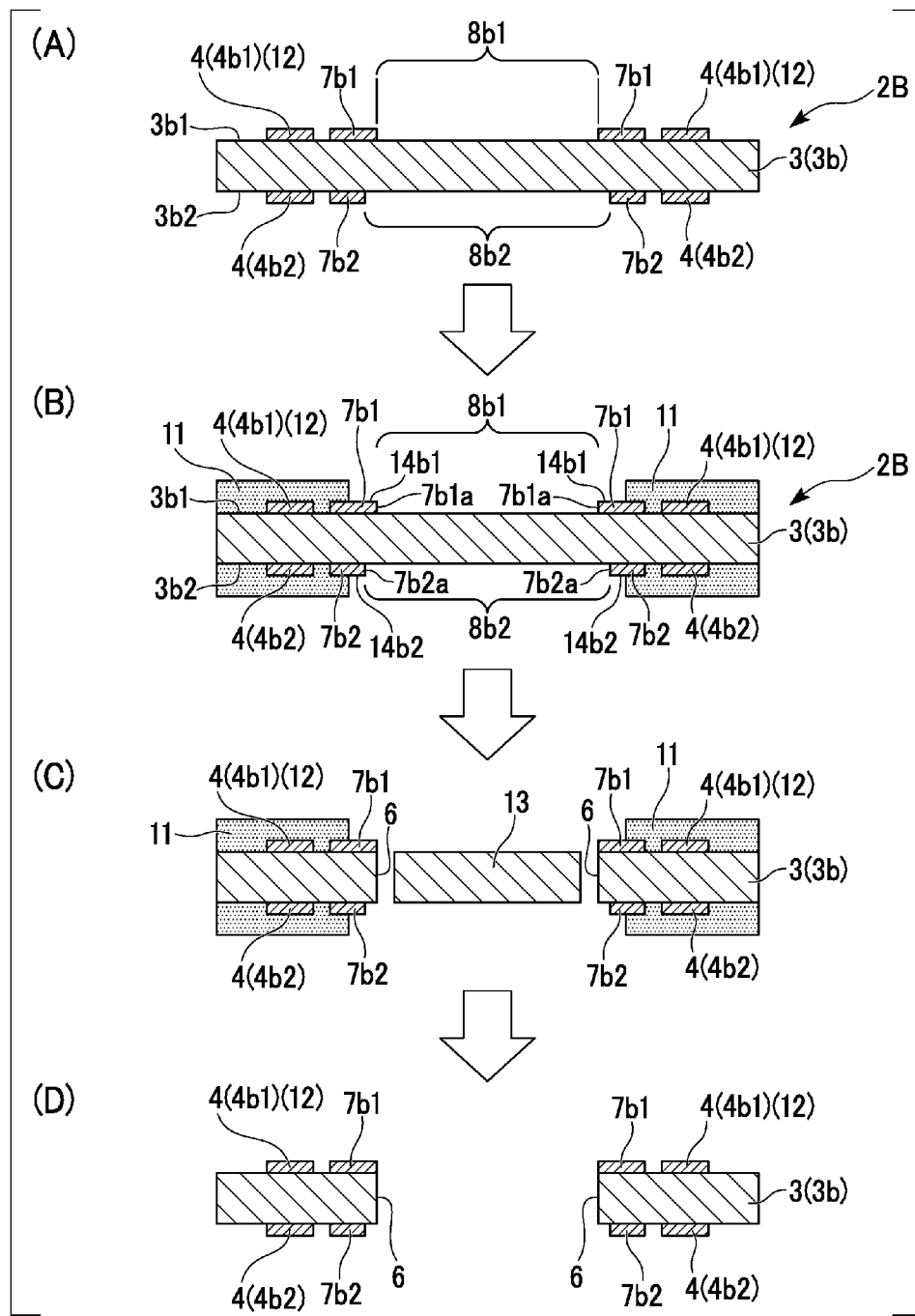
FIG. 11 is a cross-sectional view schematically showing another example of a process of forming the opening portion.

As shown in FIG. 11 (A) and FIG. 11 (B), the first face 3b1, the second face 3b2, and the conductive layer 4 (4b1, 4b2) of the insulation resin layer 3 (3b) are covered with a coating resin 11 for protection, except for the region including the inner peripheral edges 7b1a, 7b2a of the frame portions 7b1, 7b2 (inner peripheral parts 14b1, 14b2) as well as the inner regions 8b1, 8b2.

As shown in FIG. 11 (C), the wiring board 2B is exposed to an etching liquid of which the primary component is, for example, a potassium hydroxide to remove the insulation resin layer 3 (3b) in the inner region 8b1 of the frame portion 7b1 to form the opening portion 6. After that, as shown in FIG. 11 (D), the coating resin 11 is removed.

The formation of the opening portion 6 by etching may be performed to the insulation resin layer 3 before the dicing (refer to FIG. 14 and FIG. 15). When forming the opening portion 6 in the insulation resin layer 3 before the dicing, a plurality of the opening portion 6 can be formed at once, and thereby improving the manufacturing efficiency.

According to the method, the insulation resin layer 3 (3b) inside the frame portion 7b1 is removed by etching to form the opening portion 6, and thus the opening portion 6 can be easily formed with excellent accuracy.

Hereinafter, another example of a method of forming the opening portion 6 by wet etching will be explained with reference to FIG. 12.

Figure 12:
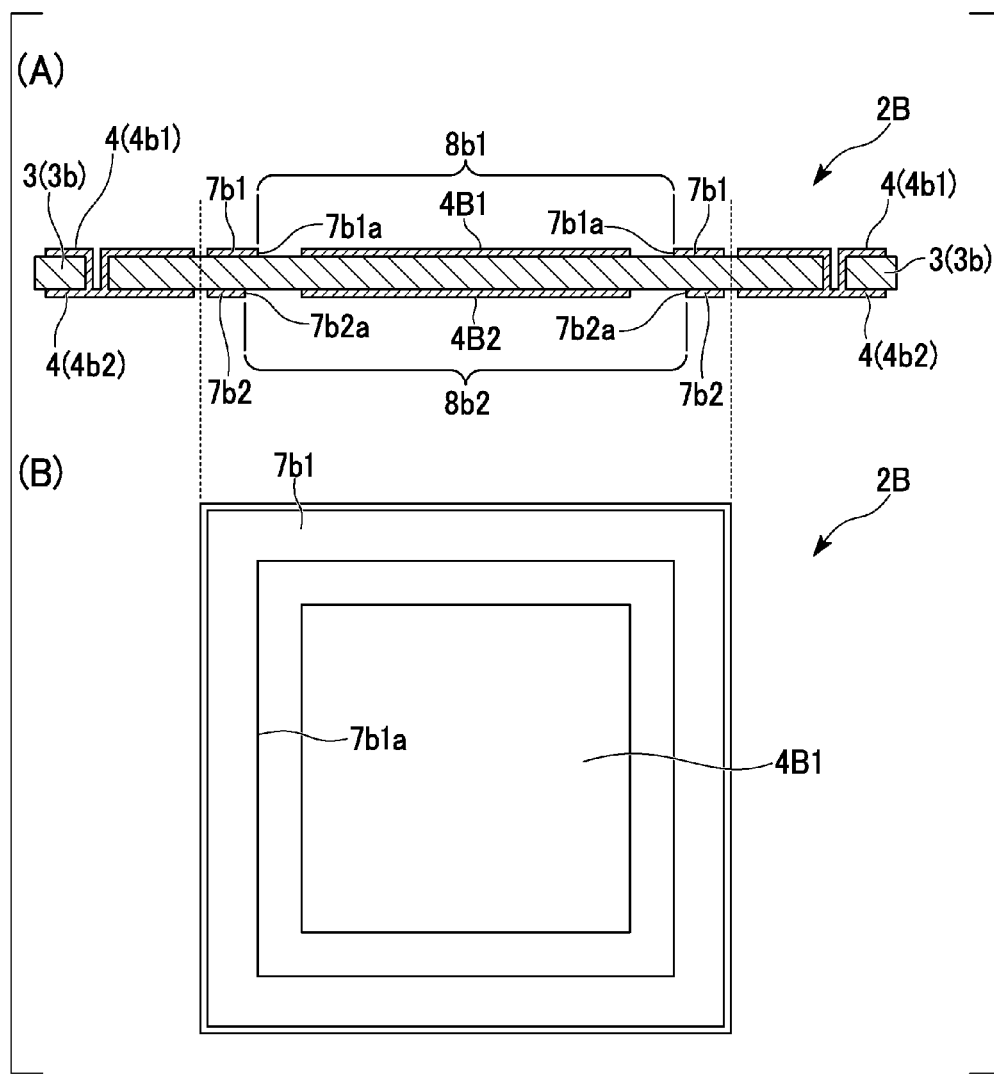
FIG. 12 is a view showing a wiring board before forming the opening portion, in which (A) is a cross-sectional view while (B) is a plan view.
Figure 13:
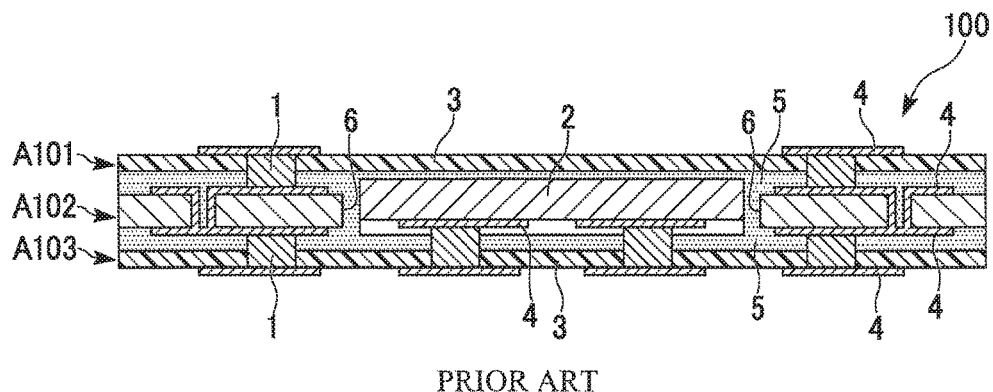
FIG. 13 is a cross-sectional view showing an example of a conventional component-embedded board.

FIG. 12 is a view showing the wiring board 2B before forming the opening portion 6, in which (A) is a cross-sectional view while (B) is a plan view.

In this method, in the process of forming the conductive layer 4 by patterning the conductive layer 4A (refer to FIG. 5), only the conductive layer present at the peripheral edge of the inner regions 8b1, 8b2 is removed as shown in FIG. 12, but the conductive layer in the inner regions 8b1, 8b2 is not entirely removed. In other words, the conductive layers 4B1, 4132 remain in the center part of the inner regions 8b1, 8b2. After that, the opening portion 6 is formed in accordance with the process shown in FIG. 11 (B)-FIG. 11 (D).

In this method, since the conductive layers 4B1, 4B2 serve as a reinforcer, it is difficult to deform the insulation resin layer 3 (3b). Therefore, the opening portion 6 can be formed with excellent accuracy.

It should be noted that, the component-embedded board 10 shown in FIG. 1 or the like includes the laminated wiring boards 1A-3A, but a component-embedded board according to the present invention may include the other wiring boards.

INDUSTRIAL APPLICABILITY

It is possible to provide a component-embedded board and a method of manufacturing the same which enable an opening portion for the embedding of an electric component to be miniaturized.

DESCRIPTION OF THE REFERENCE SYMBOLS 1,1c2 Interlayer conductive portion
2 Electric component
1A Wiring board (third board)
2A Double-sided wiring board (second board)
3 Insulation resin layer (insulation layer)
3a Insulation resin layer (third insulation layer)
4a1 Conductive layer (third conductive layer)
3b Insulation resin layer (second insulation layer)
3c Insulation resin layer (first insulation layer)
3A Lower-layer wiring board (first board)
4 Conductive layer
4b1, 4b2 Conductive layer (second conductive layer)
4c1 Conductive layer (first conductive layer)
6 Opening portion
7b1 Frame portion (frame portion of first face)
7b1a Inner peripheral edge
7b2 Frame portion (frame portion of second face)
8, 8b1, 8b2 Inner region
10 Component-embedded board

The invention claimed is:
1. A component-embedded board comprising:
a first board comprising a first insulation layer having a first face and a second face, a first conductive layer formed on the second face of the first insulation layer, and an interlayer conductive portion penetrating the first insulation layer to be connected to the first conductive layer and protruding from the first face of the first insulation layer;
an electric component connected to the interlayer conductive portion;
a second board comprising a second insulation layer having a first face, a second face, and an opening portion incorporating the electric component, and second conductive layers formed on both the first face and the second face of the second insulation layer; and
an adhesive layer that bonds the first board with the electronic component and the second board,
wherein the second conductive layers formed on the first face of the second insulation layer comprise a first frame portion having a frame shape in a plan view,
wherein the second conductive layers formed on the second face of the second insulation layer comprise a second frame portion having a frame shape in a plan view,
wherein the opening portion is formed so as to penetrate the second insulation layer in a thickness direction thereof over the entirety of an inner region of the first frame portion, the inner region defined by an inner peripheral edge of the first frame portion, wherein an edge of the first frame portion is collinear with an edge of the second insulation layer that defines the opening portion, wherein the first frame and second frame portions are electrically disconnected from the remaining parts of the second conductive layers, wherein an area of the inner region of the second frame portion is greater than an area of the inner region of the first frame portion, wherein the inner region of the second frame portion encompasses, in a plan view, the inner region of the first frame portion, the inner region of the second frame portion defined by an inner peripheral edge of the second frame portion, and wherein the second frame portion is disposed at a predetermined distance from the edge of the second insulation layer that defines the opening portion.

2. The component-embedded board according to claim 1, wherein the first board and the second board are arranged such that the first face of the first insulation layer and the second face of the second insulation layer oppose each other.

3. The component-embedded board according to claim 1,
wherein the inner peripheral edge of the second frame portion is positioned outward from the inner peripheral edge of the first frame portion in a plan view over the entire periphery, and wherein the electric component is connected to the interlayer conductive portion via the conductive layer formed on a face of the electric component, the face opposing the first board.

4. A method of manufacturing the component-embedded board according to claim 1, the method comprising:
forming the first conductive layer and the interlayer conductive portion on the first insulation layer of the first board prior to bonding with the electronic component and the second board.

5. The component-embedded board according to claim 2, further comprising:
a third board which comprises a third insulation layer having a first face and a second face, a third conductive layer formed on the first face of the third insulation layer, and an interlayer conductive portion penetrating the third insulation layer to be connected to the third conductive layer and protruding from the second face of the third insulation layer; and a second adhesive layer that bonds the third board with the first board, the electronic component, and the second board, wherein the second board and the third board are arranged such that the second face of the third insulation layer and the first face of the second insulation layer oppose each other.

6. A method of manufacturing the component-embedded board according to claim 2, the method comprising:
forming the opening portion by delivering a laser beam to the inner region of the first frame portion to penetrate the second insulation layer present inside the first frame portion in the thickness direction thereof, wherein, in forming the opening portion, the laser beam is delivered at least to a region including the inner peripheral edge of the first frame portion.

7. A method of manufacturing the component-embedded board according to claim 2, the method comprising:
forming the opening portion by penetrating the second insulation layer in the thickness direction thereof by performing a wet etching inside the first frame portion.

8. A method of manufacturing the component-embedded board according to claim 3, the method comprising:
forming the opening portion by delivering a laser beam to the inner region of the first frame portion to penetrate the second insulation layer present inside the first frame portion in the thickness direction thereof, wherein, in forming the opening portion, the laser beam is delivered at least to a region including the inner peripheral edge of the first frame portion.

9. A method of manufacturing the component-embedded board according to claim 3, the method comprising:
forming the opening portion by penetrating the second insulation layer in the thickness direction thereof by performing a wet etching inside the first frame portion.

10. A method of manufacturing the component-embedded board according to claim 5, the method comprising:
forming the third conductive layer and the interlayer conductive portion on the third insulation layer of the third board prior to bonding with the first board, the electronic component, and the second board.

* * * * *